(12) United States Patent
Pance et al.

(10) Patent No.: US 6,178,311 B1
(45) Date of Patent: Jan. 23, 2001

(54) METHOD AND APPARATUS FOR ISOLATING HIGH FREQUENCY SIGNALS IN A PRINTED CIRCUIT BOARD

(75) Inventors: Gordana Pance, Sunnyvale; Amir H. Zoufonoun, Campbell, both of CA (US)

(73) Assignee: Western Multiplex Corporation, Sunnyvale, CA (US)

(*) Notice: Under 35 U.S.C. 154(b), the term of this patent shall be extended for 0 days.

(21) Appl. No.: 09/053,845

(22) Filed: Apr. 1, 1998

Related U.S. Application Data

(63) Continuation-in-part of application No. 09/033,507, filed on Mar. 2, 1998, now abandoned.

(51) Int. Cl.[7] .............................. H04B 1/44; H04B 1/46; H04B 3/28; H01P 1/28; H01P 3/08
(52) U.S. Cl. .............................. 455/78; 455/78; 455/80; 455/81; 455/82; 333/12; 333/204; 333/246
(58) Field of Search .............................. 455/73, 78, 82, 455/83, 90, 300, 30–81; 333/1, 12, 178, 238, 244, 246, 204; 361/107, 119, 794, 780, 818, 816, 799, 800; 174/36, 262, 263, 264, 255, 250, 253

(56) References Cited

U.S. PATENT DOCUMENTS

| | | | |
|---|---|---|---|
| 3,093,805 | * 6/1963 | Osifchin et al. | 333/238 |
| 4,047,132 | * 9/1977 | Krajewski | 333/84 |
| 4,370,700 | 1/1983 | Duddles et al. . | |
| 4,498,122 | * 2/1985 | Rainal | 361/414 |
| 4,658,334 | 4/1987 | McSparran et al. . | |
| 4,677,530 | 6/1987 | Mamiya et al. . | |
| 4,691,179 | * 9/1987 | Blum et al. | 333/202 |
| 4,736,266 | * 4/1988 | Tanibe | 361/414 |
| 4,739,448 | 4/1988 | Rowe et al. . | |
| 4,821,007 | * 4/1989 | Fields et al. | 333/238 |
| 4,884,170 | 11/1989 | Ohki et al. . | |
| 4,954,929 | 9/1990 | Baran . | |
| 4,990,393 | 2/1991 | Shibano et al. . | |
| 5,039,965 | 8/1991 | Higgins, Jr. . | |
| 5,150,088 | * 9/1992 | Virga et al. | 333/238 |
| 5,165,166 | 11/1992 | Carey . | |
| 5,210,379 | 5/1993 | Okonogi et al. . | |
| 5,239,126 | 8/1993 | Oshiba . | |
| 5,262,596 | 11/1993 | Kawakami et al. . | |
| 5,278,524 | * 1/1994 | Mullen | 333/1 |
| 5,285,017 | 2/1994 | Gardner . | |
| 5,285,018 | 2/1994 | Pence, IV . | |
| 5,315,069 | 5/1994 | Gebara . | |
| 5,336,855 | * 8/1994 | Kahlert et al. | 174/250 |
| 5,353,202 | 10/1994 | Ansell et al. . | |
| 5,363,067 | * 11/1994 | Crandall et al. | 331/107 |
| 5,365,407 | 11/1994 | Nakabayashi et al. . | |
| 5,386,088 | 1/1995 | Gardner . | |
| 5,408,053 | 4/1995 | Young . | |
| 5,418,329 | 5/1995 | Katoh et al. . | |
| 5,423,080 | * 6/1995 | Perret et al. | 455/90 |
| 5,430,895 | * 7/1995 | Huusko | 455/327 |
| 5,466,892 | 11/1995 | Howard et al. . | |
| 5,484,963 | * 1/1996 | Washino | 174/261 |
| 5,519,577 | 5/1996 | Dudas et al. . | |
| 5,586,011 | 12/1996 | Alexander . | |
| 5,633,786 | * 5/1997 | Matuszewski et al. | 361/818 |

* cited by examiner

*Primary Examiner*—Daniel S. Hunter
*Assistant Examiner*—Meless Zewdu
(74) *Attorney, Agent, or Firm*—Christensen O'Connor Johnson Kindness PLLC

(57) ABSTRACT

The present invention is a method and apparatus for isolating high frequency signals in a printed circuit board. A barrier strip (36) of staggered elongated grounding slots is positioned on the circuit board to prevent stray signals from leaking from one portion of the board to another. To further improve signal isolation, additional grounding holes (80) are placed around those areas where a trace on a circuit board makes the transition from one layer to another layer in a multilayer circuit board. In addition, microstrip filters (56, 58) are attached to the power or control traces of circuitry on the board at positions where the traces cross from one section of the board to another in order to filter out any stray rf signals that may be induced by the transmitter onto the power and control traces.

15 Claims, 3 Drawing Sheets

METHOD AND APPARATUS FOR ISOLATING HIGH FREQUENCY SIGNALS IN A PRINTED CIRCUIT BOARD

RELATED APPLICATIONS

This application is a continuation-in-part of prior application Ser. No. 09/033,507, filed Mar. 2, 1998, now abandoned the priority date of which is hereby claimed under 35 U.S.C. § 120.

FIELD OF THE INVENTION

The present invention relates generally to circuit boards and, more particularly, to methods of isolating stray high frequency signals in a circuit board.

BACKGROUND OF THE INVENTION

Despite the increased data transmission rates that are possible in landline and fiber optic networks, many communication systems employ radio frequency links to transmit and receive information. Such radio frequency links are used for point to point communication between telephone switches, between cellular telephone sites, or in satellite communication. For some high speed data communication applications some radio frequency links employ relatively high power transceivers, which may operate in the microwave frequency range.

A radio frequency (rf) transceiver typically includes a high power transmitter that broadcasts rf signals to a remote location and a receiver that detects weaker rf signals that are broadcast from the remote location. In a transceiver where the receiver is tuned to a frequency that is near the carrier frequency of the transmitter (or a multiple thereof), the transmitter may generate stray signals that could leak into the receiver and saturate it. When saturated, the receiver is generally unable to detect the rf signals that are transmitted from a remote location.

One prior art approach used to prevent the stray rf signals from leaking into a receiver is to physically separate the transmitter and the receiver. For example, a transmitter assembly may be placed in a separate cavity and shielded from the receiver assembly. While the physical separation of the transmitter assembly and the receiver assembly in two different cavities reduces the rf leakage problem, this approach typically increases the cost and overall dimensions of the radio transceiver.

Alternatively, attempts have been made to place the transmitter and receiver circuits on the same printed circuit board, while employing traditional shielding methods such as enclosing portions of the transmitter in a grounded metal shell or placing grounding holes or vias between the transmitter and receiver to isolate stray rf signals. However, such conventional isolation techniques generally do not prove effective in providing the desired level of isolation for satisfactory operation of a transceiver when operated at high power in certain applications.

Accordingly, there is a need for a better isolation technique for use in circuit boards to reduce the level of leakage signals from one portion of the board to another.

SUMMARY OF THE INVENTION

The present invention is a method of isolating portions of a circuit board in order to prevent signals from one part of the board from leaking into other parts of the board. In one embodiment of the invention, the isolating technique is used in a high power radio frequency transceiver having an integrated transmitter and receiver that are mounted on a single multilayer printed circuit board. The isolation technique involves placing a barrier strip between the transmitter and the receiver. The barrier strip is formed of an arrangement of grounding slots. The grounding slots may be oval in shape and staggered such that stray signals cannot pass through the barrier but signal traces on the board can be routed through the barrier strip.

According to another aspect of the invention, additional isolation is provided by placing a plurality of grounding holes or vias around those areas on the multilayer printed circuit board where a signal trace makes a transition from one layer to another layer on the printed circuit board.

According to yet another aspect of the present invention, microstrip filters are placed on the power or control lines at the point where such central lines pass from one area of the circuit board to another in order to further improve signal isolation. By placing microstrip filters on the power or control lines, the stray rf signals that may be induced onto the lines by the transmitter may be substantially prevented from reaching the receiver.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
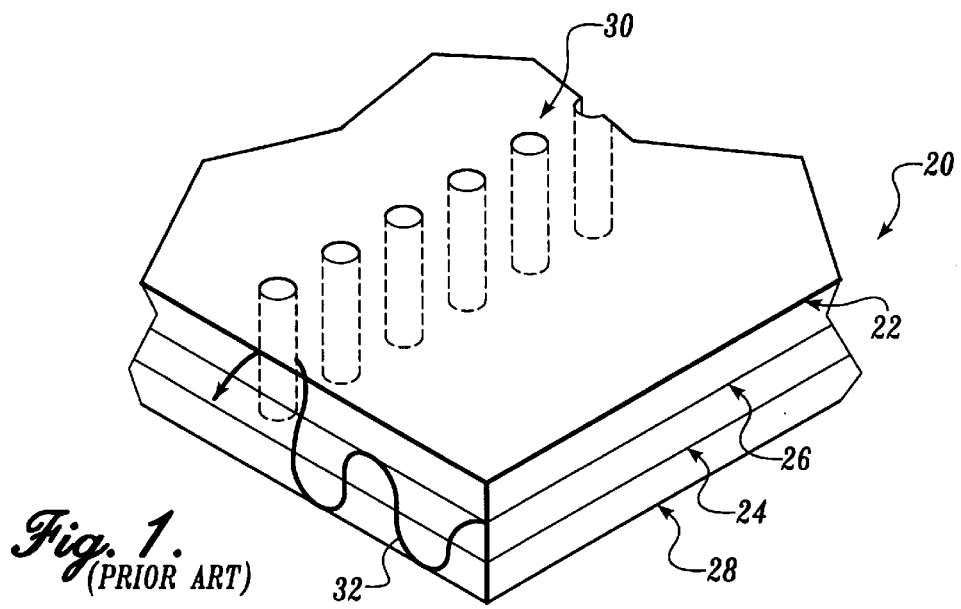
FIG. 1 is an isometric view of a multilayer circuit board that illustrates a prior art shielding technique to isolate stray rf signals in the circuit board.

As discussed above, circuits that operate at high frequency on a common circuit board suffer from stray rf signals leaking from one portion of the circuit board to another. For example, FIG. 1 illustrates a typical multilayer printed circuit board 20 that generally comprises a top signal layer 22 and a middle signal layer 24. Disposed between the top signal layer and the middle signal layer is a first ground plane 26. A second ground plane 28 is formed on the bottom of the circuit board. Each layer 22, 24, 26, and 28 is separated by a non-conducting dielectric layer. If used in a radio transceiver the electronic components that comprise the transmitter circuitry of the rf transceiver and the components that comprise the receiver circuitry are located on different areas of the printed circuit board.

To isolate the receiver from the transmitter, it is known to place one or more barriers of grounding holes or vias 30 between the transmitter and the receiver. Each grounding hole or via is a circular hole that extends all the way through the printed circuit and is filled with a conductive material such as solder. The grounding holes make electrical contact with each of the ground planes 26 and 28 and may also be tied to ground leads on the top and middle signal layers 22 and 24. When viewed through the printed circuit board, the circular grounding holes form a "picket fence" through which stray rf signals 32 that originate from the transmitter should not pass. While the arrangement of grounding holes or vias 30 shown in FIG. 1 does prevent some of the rf signals produced by the transmitter from reaching the receiver, some of the stray signals produced by the transmitter can pass through the row of grounding holes and into the receiver circuitry. In general, the ability of the grounding holes to shunt stray rf signals to ground depends on the circumference of the grounding holes. As the holes become smaller, the circumference decreases, but the inductive reactance of the holes increases which is undesirable. However, simply increasing the diameter of the holes has not proved successful because it is difficult to place the holes sufficiently close together so that the stray rf signals will not pass through. Furthermore, attempts to reduce the stray rf signals that leak through the arrangement of grounding holes by decreasing the spacing between the grounding holes has not proven successful because the strength of the circuit board also decreases, thereby subjecting the board to mechanical failure.

Figure 2:
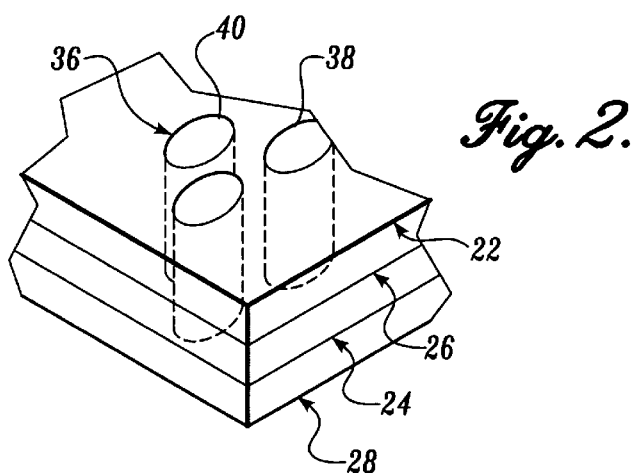
FIG. 2 is an isometric view of a circuit board employing a barrier strip of a number of elongated grounding slots according to one embodiment of the present invention.

FIG. 2 illustrates a technique of the present invention that operates to reduce the amount of stray rf signals that leak from one portion of a printed circuit board to another. The present invention utilizes a barrier strip 36 that comprises a plurality of grounding slots. The barrier strip 36 is arranged in two parallel rows of grounding slots 38, 40, with the individual grounding slots in each row being offset so that adjacent grounding slots are staggered. The grounding slots are preferably elongated or oval in shape and have a sufficiently large circumference so that the inductive reactance of each slot is relatively low at microwave frequencies, i.e., 1–26 GHz. By staggering the elongated slots, any stray rf signals which pass through the first row of grounding slots 38 are reflected by the second row of elongated grounding slots 40.

Figure 3:
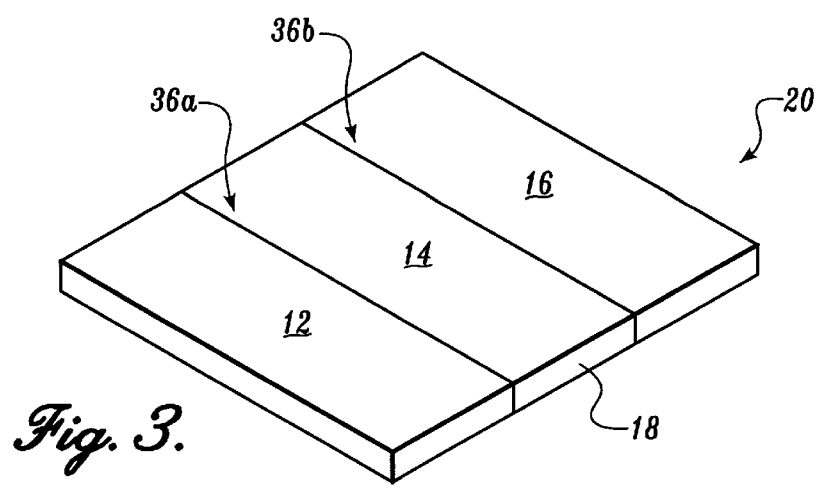
FIG. 3 is a pictorial diagram of an integrated rf transceiver that illustrates one application of the present invention.

The barrier strip 36 of elongated grounding slots of the type shown in FIG. 2 can be placed anywhere on the circuit board where it is desirable to isolate stray rf signals. For example, FIG. 3 illustrates one example of a printed circuit that uses the barrier strips 36 to shield signals from a transmitter and a receiver in an integrated rf transceiver. The transceiver 10 generally comprises a transmitter circuitry 12, a power supply and control logic circuitry 14, and a receiver circuitry 16, all of which are integrated into a single multilayer printed circuit board 18. The printed circuit board 18 is roughly divided into three equal sections with the transmitter circuitry 12 and receiver circuitry 16 being located on the outer sections of the board and the power supply and control logic circuitry 14 being located in the center of the board between the transmitter circuitry 12 and receiver circuitry 16. Placing the power supply and control logic circuitry 14 between the transmitter circuitry 12 and receiver circuitry 16 not only facilitates the routing of power and control signals to transmitter circuitry 12 and receiver circuitry 16 but also increases the isolation between the transmitter circuitry 12 and the receiver circuitry 16. In the presently preferred embodiment of the invention, the circuit board shown in FIG. 3 contains at least two barrier strips 36a and 36b that extend along the length of the board. The barrier strip 36a separates the transmitter circuitry 12, from the power supply and control logic circuitry 14. The barrier strip 36b separates the power supply and control logic circuitry 14, from the receiver circuitry 16.

Figure 4:
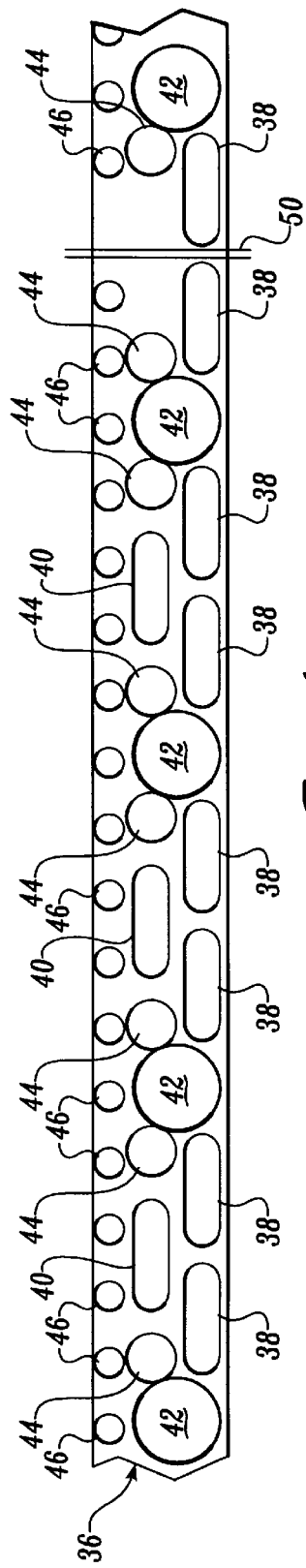
FIG. 4 illustrates how the elongated grounding slots shown in FIG. 2 are arranged in a staggered pattern in order to isolate stray rf signals between a transmitter and a receiver on a circuit board.

FIG. 4 illustrates a more detailed view of the barrier strips 36 that separate the transmitter from the power supply and control logic circuitry of the transceiver as well as separating the receiver circuitry from the power supply and control logic circuitry. As indicated above, the barrier strip 36 comprises the two rows of staggered grounding slots 38 and 40 that effectively ground any stray rf signals that may be traveling in the waveguide formed by the upper and lower ground planes.

Also included in the barrier strip 36 are one or more screw holes 42 in which additional metal shielding strips can be mounted. The screw holes 42 are preferably plated through and are grounded to effectively ground the attached shielding strip. The screw holes 42 are preferably disposed in line with the two rows of staggered grounding slots 38 and 40. To prevent stray rf signals from leaking around the screw holes 42, a pair of circular grounding holes 44 are positioned on either side of the screw holes 42, so that the circular grounding holes 44 are also in line with the row of elongated grounding slots 40. The grounding holes 44 were chosen to have a circular shape, rather than an oval shape like the elongated grounding slots, in order to increase the strength of the printed circuit boards in the area of the barrier strip 36. The barrier strip 36 may also include a row of grounding holes 46 that lie next to the row of elongated grounding slots 40 in order to provide additional isolation.

As will be appreciated, there are some places on the circuit board where a signal trace 50 needs to pass from one side of the barrier to another. The space between the individual grounding slots that comprise the rows 38 and 40 is sufficient to allow a trace to be routed through the barrier. In addition, it may be necessary to omit a grounding slot in the row 40 in order to avoid unnecessary bends in the trace 50.

In some instances, it is not necessary to include the screw holes 42, the circular grounding holes 44, or the row of circular grounding holes 46 in the barrier strip 36. In that case, the barrier strip can comprise only two rows of staggered elongated grounding slots.

While the barriers strip 36 provides a high level of isolation between the transmitter and the receiver circuitry, there are additional mechanisms by which stray rf signals may leak into the receiver circuitry. For example, it has been determined that one way in which signals leak from the transmitter to the receiver circuitry is on the power or control traces that pass from the transmitter to the power or control logic circuitry, or receiver circuitry of the transceiver. To counteract this, the present invention places filters on the power and control lines at a position as close as possible to the point whereby the traces pass from one section of the multilayer circuit board to another.

Figure 5:
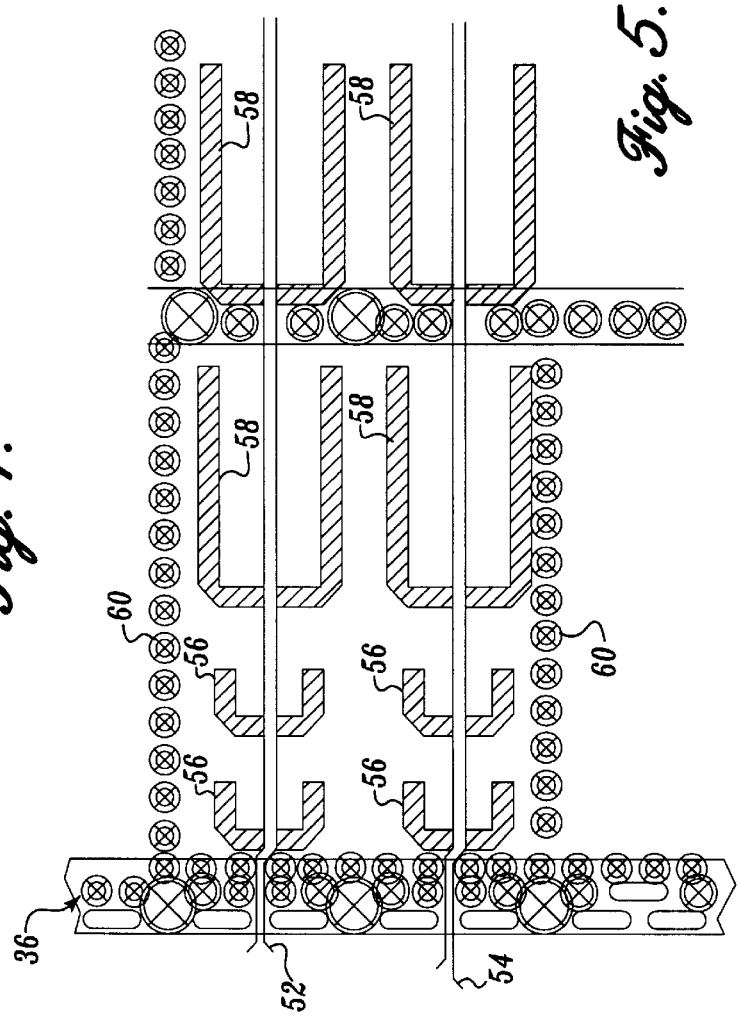
FIG. 5 illustrates how a number of microstrip filters are placed on the power and control lines in the multilayer printed circuit board in order to further isolate stray rf signals according to another aspect of the present invention.

FIG. 5 illustrates a pair of power or control traces 52, 54 that pass through a barrier strip 36 that separates the transmitter circuitry on the right of the barrier strip from the power supply and control logic circuitry on the left side of the barrier strip. To eliminate any stray rf signals that may have been induced on the power or control traces 52, 54, the present invention places a number of microstrip filters on the power or control traces 52, 54 at a position just before they cross through the barrier strip 36. The filters comprise a pair of high frequency filters 56 and a pair of larger low frequency filters 58 on each power or control trace 52 and 54. As will be appreciated by those skilled in the art, the physical dimensions of the microstrip filters 56 and 58 are dependent upon the operating frequency of the transmitter and the frequency of the stray rf signals that are induced on the traces by the transmitter circuitry. In addition to placing the filters on the control traces 52 and 54, the present invention also surrounds the filters with a series of circular grounding holes 60, in order to further prevent stray rf signals from reaching the power or control traces 52 and 54.

Figure 6:
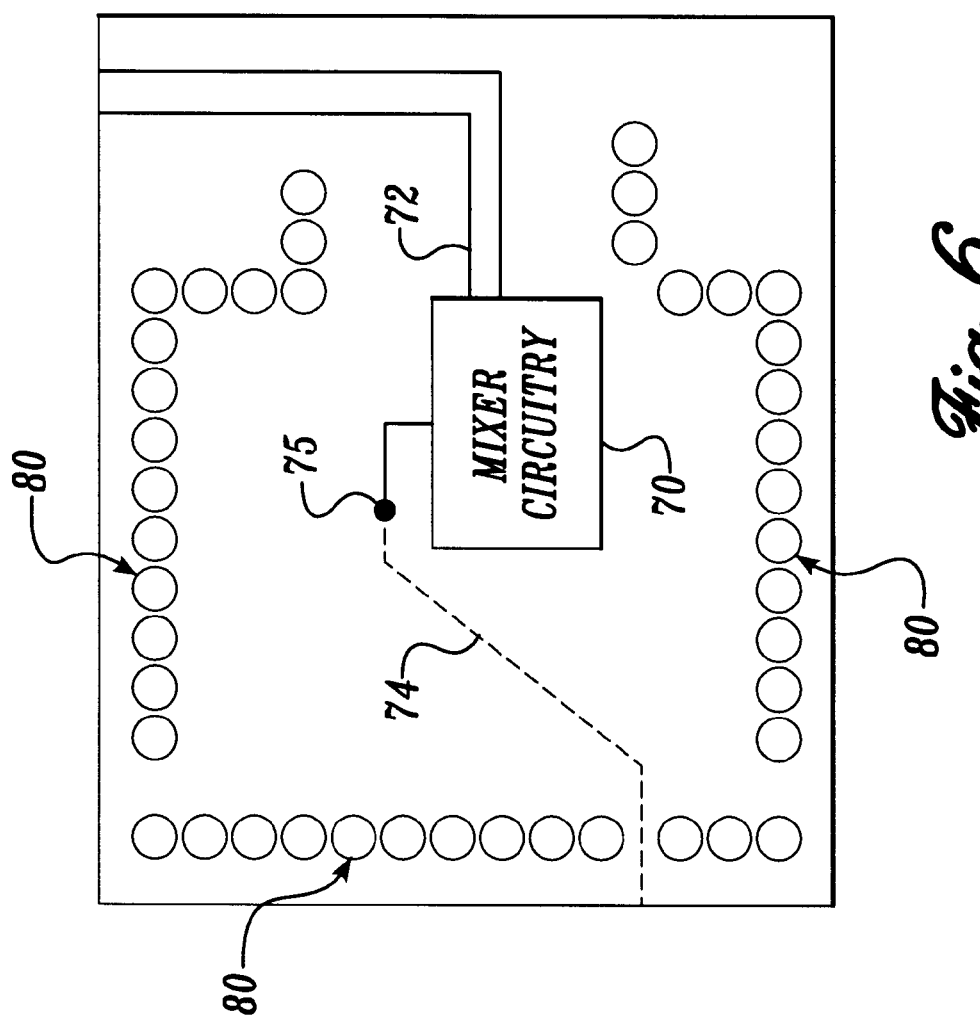
FIG. 6 illustrates how grounding holes are placed around the areas of a multilayer circuit board where a signal trace makes a transition from one layer of the board to another according to yet another aspect of the present invention.

In addition to placing the barrier strips between the transmitter and receiver and placing filters on the power supply and control traces, an additional source of stray rf signal leakage has been located. It has been determined that rf signals can be transferred from one portion of the circuit board to another at the areas where a circuit trace makes a transition from one layer of the multilayer circuit board to another. FIG. 6 illustrates a portion of the transmitter circuitry that contains a mixer for increasing the frequency of a signal to be transmitted. The mixer circuitry 70 is connected to a trace 72 that is located on the top signal layer of the multilayer circuit board. In addition, the mixer circuitry 70 is connected to another trace 74 (shown in dashed lines), that is located on the middle signal layer of the multilayer circuit board. The trace 74 makes a transition from the middle layer to the top layer at a point 75 to connect to the mixer circuitry. It has been determined that the point 75 is susceptible to stray rf signals that can be leaked to the rest of the circuit board. To counteract this problem, the present invention surrounds the mixer circuitry 70 and, in particular, the point whereby a signal trace makes a transition from one layer of the circuit board to another with a series of circular grounding holes 80 that effectively shunt any stray rf signals that are emitted from the mixer circuitry 70 to ground. Although circular grounding holes are currently used to surround the areas whereby the trace makes a transition from one layer of the circuit board to another, the elongated grounding slots described above could also be used.

As will be appreciated, the present invention is a technique that largely prevents stray rf signals from being carried from one portion of a printed circuit board to another. By using a combination of barrier strips formed of the staggered grounding slots, microstrip filters on the power and control traces at positions where the traces cross from one portion of the circuit board to another, as well as by surrounding the are whereby a circuit trace makes a transition from one layer of the circuit board to another, the present invention can achieve a high degree of isolation. In an actual embodiment of the invention, the level of isolation between the transmitter and receiver portions of the radio frequency transceiver can exceed 130 dB. This allows the transceiver to be manufactured on a single printed circuit board thereby decreasing size and cost of the transceiver.

While the preferred embodiment of the invention has been illustrated and described, it will be appreciated that various changes can be made therein without departing from the spirit and scope of the invention. For example, the shape of the elongated grounding slots may have different geometric shapes such as rectangular or elliptical, so that the circumference of the slots is increased, but still allow the slots to be placed in close, proximity while still providing the desired level of isolation in the multilayer circuit board. In addition, the techniques of the present invention are not limited to single board rf transceivers. The techniques can also be applied to pagers, cellular telephones, satellite systems, cellular modems or other applications where achieving a high degree of isolation between portions of a circuit board is desirable.

The embodiments of the invention in which an exclusive property or privilege is claimed are defined as follows:

1. A printed circuit board including a transmitter disposed on one portion of the printed circuit board and a receiver disposed on another portion of the printed circuit board, and wherein the printed circuit board further includes a power supply and control logic circuit that supplies power and control signals to the transmitter and receiver on power and control traces disposed on the printed circuit board, comprising:

a barrier strip formed of a plurality of grounding slots arranged in a staggered pattern disposed between the transmitter and the receiver on the printed circuit board; and one or more microstrip filters coupled to the power and control traces to filter stray rf signals that may be induced on the power and control traces by the transmitter.

2. The printed circuit board of claim 1, wherein at least one of the plurality of grounding slots is elongated in shape.

3. The printed circuit board of claim 1, wherein the plurality of grounding slots are arranged in a first row and a second row, the second row being offset from the first row to stagger the grounding slots.

4. The printed circuit board of claim 1, wherein the power and control traces cross the barrier strip and the microstrip filters are coupled to the power and control traces at a position near where the traces cross the barrier strip.

5. The printed circuit board of claim 1, wherein the printed circuit board is a multilayer printed circuit board that includes traces that make a transition from a first signal layer to a second signal layer, and wherein the printed circuit board further includes a pattern of grounding holes disposed on the printed circuit board around the area where a trace makes such a transition.

6. An isolator for use in a printed circuit board to prevent stray signals from leaking from one area on a printed circuit board to another, comprising:

a barrier strip formed of a plurality of grounding slots arranged in a staggered pattern on a layer of the printed wiring board, wherein the printed circuit board includes traces that cross the barrier strip, the traces carrying signals from one area of the printed circuit board to another, the isolator further comprising:

one or more microstrip filters disposed on the traces at a position near where the traces cross the barrier strip.

7. The isolator of claim 1, wherein at least one of the plurality of grounding slots is elongated in shape.

8. The isolator of claim 7, wherein the plurality of grounding slots are arranged in a first row and a second that is adjacent the first row, the second row being offset from the first row to stagger the grounding slots.

9. The isolator of claim 8, wherein the printed circuit board is a multilayer board that has traces that transition from a first layer of the multilayer board, the isolator further comprising:

a plurality of grounding holes that surround a trace at a position where the trace transitions from the first to the second layer of the multilayer printed circuit board.

10. The isolator of claim 1, wherein the printed circuit board includes a transmitter disposed on one portion of the printed circuit board and a receiver disposed on another portion of the printed circuit board, the barrier strip being disposed between the transmitter and the receiver on the printed circuit board.

11. The isolator of claim 10 wherein the printed circuit board further includes a power supply and control logic circuit that supplies power and control signals to the transmitter and receiver on power and control traces disposed on the printed circuit board, and wherein the power and control traces have microstrip filters coupled to the traces to filter stray rf signals that may be induced on the power and control traces by the transmitter.

12. The isolator of claim 10, wherein the printed circuit board is a multilayer printed circuit board that includes traces that make a transition from a first signal layer to a second signal layer and wherein the printed circuit board further includes a pattern of grounding holes disposed on the printed circuit board where a trace makes such a transition.

13. The isolator of claim 1 wherein a first slot of the plurality of slots has a width that is greater than a spacing between a pair of adjacent slots of the plurality of slots, the first slot being adjacent to the pair of adjacent slots.

14. The isolator of claim 13 wherein the first slot is positioned to be aligned with and overlapping the spacing between the pair of adjacent slots.

15. The isolator of claim 13 wherein the plurality of slots have dimensions predetermined to optimize the printed circuitboard's strength and the inductive resistance for RF signals of a predetermined frequency range.

* * * * *